United States Patent
Markov et al.

(10) Patent No.: US 12,080,355 B2
(45) Date of Patent: Sep. 3, 2024

(54) METHOD OF IMPROVING READ CURRENT STABILITY IN ANALOG NON-VOLATILE MEMORY BY POST-PROGRAM TUNING FOR MEMORY CELLS EXHIBITING RANDOM TELEGRAPH NOISE

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 32 days.

(21) Appl. No.: 17/481,225

(22) Filed: Sep. 21, 2021

(65) Prior Publication Data

US 2022/0392543 A1 Dec. 8, 2022

Related U.S. Application Data

(60) Provisional application No. 63/196,130, filed on Jun. 2, 2021.

(51) Int. Cl.
*G11C 16/26* (2006.01)
*G11C 16/04* (2006.01)
(Continued)

(52) U.S. Cl.
CPC .......... *G11C 16/26* (2013.01); *G11C 16/0425* (2013.01); *G11C 16/14* (2013.01); *G11C 16/3431* (2013.01)

(58) Field of Classification Search
CPC ................. G11C 2013/0066; G11C 13/0069
(Continued)

(56) References Cited

U.S. PATENT DOCUMENTS 5,029,130 A 7/1991 Yeh
6,747,310 B2 6/2004 Fan et al.
(Continued)

FOREIGN PATENT DOCUMENTS

JP 2003187588 7/2003

OTHER PUBLICATIONS

U.S. Appl. No. 16/915,289, filed Jun. 29, 2020 entitled "Method of Improving Read Current Stability in Analog Non-Volatile Memory by Program Adjustment for Memory Cells Exhibiting Random Telegraph Noise," Markov, et al.
(Continued)

*Primary Examiner* — Anthan Tran
(74) *Attorney, Agent, or Firm* — DLA Piper LLP (US)

(57) ABSTRACT

A memory device and method for a non-volatile memory cell having a gate that includes programming the memory cell to an initial program state corresponding to a target read current and a threshold voltage, including applying a program voltage having a first value to the gate, storing the first value in a memory, reading the memory cell in a first read operation using a read voltage applied to the gate that is less than the target threshold voltage to generate a first read current, and subjecting the memory cell to additional programming in response to determining that the first read current is greater than the target read current. The additional programming includes retrieving the first value from the memory, determining a second value greater than the first value, and programming the selected non-volatile memory cell that includes applying a program voltage having the second value to the gate.

20 Claims, 5 Drawing Sheets

(51) Int. Cl.
*G11C 16/14* (2006.01)
*G11C 16/34* (2006.01)

(58) Field of Classification Search
USPC ........................................................ 365/185.2
See application file for complete search history.

(56) References Cited

U.S. PATENT DOCUMENTS

| | | |
|---|---|---|
| 6,855,980 B2 | 2/2005 | Wang et al. |
| 7,315,056 B2 | 1/2008 | Klinger |
| 7,868,375 B2 | 1/2011 | Liu et al. |
| 8,711,636 B2 | 4/2014 | Do et al. |
| 8,908,441 B1 | 12/2014 | Dutta et al. |
| 2002/0036925 A1 | 3/2002 | Tanzawa |
| 2004/0246798 A1 | 12/2004 | Guterman |
| 2005/0083735 A1 | 4/2005 | Chen et al. |
| 2008/0175055 A1 | 7/2008 | Kim |
| 2009/0296471 A1* | 12/2009 | Goda ............ G11C 16/06 365/185.11 |
| 2010/0259979 A1 | 10/2010 | Jia |
| 2012/0008389 A1 | 1/2012 | Kim |
| 2012/0113714 A1 | 5/2012 | Choy |
| 2012/0269004 A1 | 10/2012 | Kim et al. |
| 2013/0039130 A1 | 2/2013 | Lee |
| 2014/0082440 A1 | 3/2014 | Ho |
| 2016/0019948 A1 | 1/2016 | Pang et al. |
| 2016/0077912 A1 | 3/2016 | Mateescu |
| 2016/0293271 A1 | 10/2016 | Won |
| 2017/0206981 A1 | 7/2017 | Nafziger |
| 2017/0337466 A1* | 11/2017 | Bayat ............ G11C 16/08 |
| 2019/0139602 A1 | 5/2019 | Tiwari |
| 2020/0065023 A1 | 2/2020 | Markov et al. |
| 2021/0019608 A1 | 1/2021 | Tran et al. |
| 2021/0065837 A1 | 3/2021 | Markov et al. |
| 2022/0051739 A1* | 2/2022 | Hwang ............ G11C 16/30 |

OTHER PUBLICATIONS

*Negative bias temperature instability: What do we understand?* by Dieter K. Schroder, in Microelectronics Reliability 47 (2007) 841-852, Department of Electrical Engineering and Center for Solid State Electronics Research, Arizona State University, Tempe, AZ 85287-5706, USA.
PCT Search Report and Written Opinion dated May 3, 2021 for PCT Patent Application No. US 2021/017007 filed on Feb. 8, 2021.
Taiwanese Office Action mailed on May 31, 2023 corresponding to the related Taiwanese Patent Application No. 111119037.

\* cited by examiner

METHOD OF IMPROVING READ CURRENT STABILITY IN ANALOG NON-VOLATILE MEMORY BY POST-PROGRAM TUNING FOR MEMORY CELLS EXHIBITING RANDOM TELEGRAPH NOISE

RELATED APPLICATIONS

This application claims the benefit of U.S. Provisional Application No. 63/196,130, filed Jun. 2, 2021, and which is incorporated herein by reference.

FIELD OF THE INVENTION

The present invention relates to non-volatile memory devices, and more particularly to improving the stability of memory cell current during read operations.

BACKGROUND OF THE INVENTION

Non-volatile memory devices are well known in the art. See for example U.S. Pat. No. 7,868,375, which discloses a four-gate memory cell configuration, and which is incorporated herein by reference for all purposes. Specifically, FIG. 1 of the present application illustrates a split gate memory cell 10 with spaced apart source and drain regions 14/16 formed in a silicon semiconductor substrate 12. The source region 14 can be referred to as a source line SL (because it commonly is connected to other source regions for other memory cells in the same row or column), and the drain region 16 is commonly connected to a bit line by a bit line contact 28. A channel region 18 of the substrate is defined between the source/drain regions 14/16. A floating gate 20 is disposed vertically over and insulated from (and controls the conductivity of) a first portion of the channel region 18 (and partially vertically over and insulated from the source region 14). A control gate 22 is disposed vertically over and insulated from the floating gate 20. A select gate 24 is disposed vertically over and insulated from (and controls the conductivity of) a second portion of the channel region 18. An erase gate 26 is disposed vertically over and insulated from the source region 14 and is laterally adjacent to the floating gate 20. A plurality of such memory cells can be arranged in rows and columns to form a memory cell array.

Various combinations of voltages are applied to the control gate 22, select gate 24, erase gate 26 and/or source and drain regions 14/16, to program the split gate memory cell 10 (i.e., inject electrons onto the floating gate), to erase the split gate memory cell 10 (i.e., remove electrons from the floating gate), and to read the split gate memory cell 10 (i.e., measure or detect the conductivity of the channel region 18 to determine the programming state of the floating gate 20).

Split gate memory cell 10 can be operated in a digital manner, where the split gate memory cell 10 is set to one of only two possible states: a programmed state and an erased state. The split gate memory cell 10 is erased by placing a high positive voltage on the erase gate 26, and optionally a negative voltage on the control gate 22, to induce tunneling of electrons from the floating gate 20 to the erase gate 26 (leaving the floating gate 20 in a more positively charged state—the erased state). Split gate memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with electrons becoming accelerated and heated whereby some of them are injected onto the floating gate 20 by hot-electron injection (leaving the floating gate 20 in a more negatively charged state—the programmed state). Split gate memory cell 10 can be read by placing positive voltages on the select gate 24 (turning on the portion of channel region 18 under the select gate 24) and drain region 16 (and optionally on the erase gate 26 and/or the control gate 22), and sensing current flow through the channel region 18. If the floating gate 20 is positively charged (i.e. split gate memory cell 10 is erased), the split gate memory cell 10 will turn on, and electrical current will flow from drain region 16 to source region 14 (i.e. the split gate memory cell 10 is sensed to be in its erased "1" state based on sensed current flow). If the floating gate 20 is negatively charged (i.e. split gate memory cell 10 is programmed), the portion of channel region 18 under the floating gate is turned off, thereby preventing appreciable current flow (i.e., the split gate memory cell 10 is sensed to be in its programmed "0" state based on no, or minimal, current flow).

Table 1 provides non-limiting examples of erase, program and read voltages, where Vcc is power supply voltage or another positive voltage such as 2.5 V.

TABLE 1

|  | WL (SG) | BL (Drain) | Source | EG | CG |
|---|---|---|---|---|---|
| Erase | 0 V | 0 V | 0 V | 11.5 V | 0 V |
| Program | 1 V | 1 µA | 4.5 V | 4.5 V | 10.5 V |
| Read | Vcc | 0.6 V | 0 V | 0 V | Vcc |

Split gate memory cell 10 can alternately be operated in an analog manner where the memory state (i.e. the amount of charge, such as the number of electrons, on the floating gate 20) of the split gate memory cell 10 can be continuously changed anywhere from a fully erased state (minimum number of electrons on the floating gate 20) to a fully programmed state (maximum number of electrons on the floating gate 20), or just a portion of this range. This means the split gate memory cell 10 storage is analog, which allows for very precise and individual tuning of each split gate memory cell 10 in an array of split gate memory cells 10. Alternatively, the split gate memory cell 10 could be operated as an MLC (multilevel cell) where it is configured to be programmed to one of many discrete values (such as 16 or 64 different values). In the case of analog or MLC programming, the programming voltages are applied for a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Split gate memory cell 10 operated in an analog manner or as an MLC may be more sensitive to noise and read current instabilities which can adversely affect the accuracy of the split gate memory cell 10. One source of read current instability in analog non-volatile memory devices is the capture and emission of electrons by oxide traps located at the interface and near-interface between the gate oxide and memory cell channel region. The gate oxide is the insulation layer that separates the floating gate 20 from the channel region 18 of substrate 12. When an electron is captured on an interface trap, it reduces the channel conductivity during a read operation, and thus increases the threshold voltage Vt of the split gate memory cell 10 (i.e., the minimum voltage on the control gate 22 needed to turn on the channel region 18 of the split gate memory cell 10 to produce a predetermined target current, 1 µA being an example). When the control gate voltage is at or above the threshold voltage Vt, a conducting path is created between the source region 14 and the drain region 16, and a current of at least the predetermined target current flows. When the control gate voltage is below the threshold voltage Vt, a conducting path is not created, and any current between the source region 14 and the drain region 16 is considered sub-threshold or leakage current. An electron captured on an interface trap can be emitted from the interface trap, which decreases threshold voltage Vt of the memory cell, and thus increases the channel conductivity during a read operation. These single-electron events of electron capture and emission by interface traps appear as read current noise and are referred to as random telegraph noise (RTN). In general, RTN produced by a single interface trap is characterized by two states: a lower Vt state (and higher read current state) when an electron is emitted from the interface trap and a higher Vt state (and lower read current state) when an electron is captured by the interface trap. As described above, the instability of the split gate memory cell 10 during read can be characterized either by the threshold voltage Vt, i.e. the control gate voltage corresponding to the predetermined target current or by memory cell current under given read voltage conditions. The present examples are particularly described in relation to memory cell read instability as threshold voltage Vt, however the use of memory cell current under given read voltages are specifically contemplated.

RTN that occurs during programming can be addressed as part of the program operation. However, one issue with RTN is that electron emission that undesirably decreases the threshold voltage Vt of the memory cell (and therefore undesirably increases channel conductivity during a read operation) can occur after programming of the memory cell is completed. Therefore, there is a need to address RTN in analog and MLC non-volatile memory devices, such as split gate memory cell 10, without limitation, to compensate for post-program RTN.

BRIEF SUMMARY OF THE INVENTION

The aforementioned problems and needs are addressed by a memory device that comprises a plurality of non-volatile memory cells each comprising a first gate, and a control circuitry. The control circuitry is configured to:
program a selected non-volatile memory cell of the plurality of non-volatile memory cells to an initial program state that corresponds to a threshold voltage for the first gate of the selected non-volatile memory cell meeting or exceeding a target threshold voltage for the first gate of the selected non-volatile memory cell, wherein the target threshold voltage for the first gate corresponds to a target read current, wherein the programing of the selected non-volatile memory cell includes apply a program voltage having a first value to the first gate,
store the first value in a memory,
read the selected non-volatile memory cell in a first read operation using a read voltage applied to the first gate of the selected non-volatile memory cell that is less than the target threshold voltage for the first gate to generate a first read current, and
subject the selected non-volatile memory cell to additional programming in response to a determination that the first read current is greater than the target read current, wherein the additional programming comprises:
retrieve the first value from the memory,
determine a second value greater than the first value, and
program the selected non-volatile memory cell that includes applying a program voltage having the second value to the first gate.

A method of programming a selected non-volatile memory cell of a plurality of non-volatile memory cells, wherein each of the plurality of non-volatile memory cells includes a first gate, the method comprising:
programming the selected non-volatile memory cell to an initial program state that corresponds to meeting or exceeding a target threshold voltage for the first gate of the selected non-volatile memory cell, wherein the target threshold voltage corresponds to a target read current, wherein the programing includes applying a program voltage having a first value to the first gate,
storing the first value in a memory,
reading the selected non-volatile memory cell in a first read operation using a read voltage applied to the first gate of the selected non-volatile memory cell that is less than the target threshold voltage to generate a first read current, and
subjecting the selected non-volatile memory cell to additional programming in response to determining that the first read current is greater than the target read current, wherein the additional programming comprises:
retrieving the first value from the memory,
determining a second value greater than the first value, and
programming the selected non-volatile memory cell that includes applying a program voltage having the second value to the first gate.

Other objects and features will become apparent by a review of the specification, claims and appended figures.

DETAILED DESCRIPTION OF THE INVENTION

Figure 1:
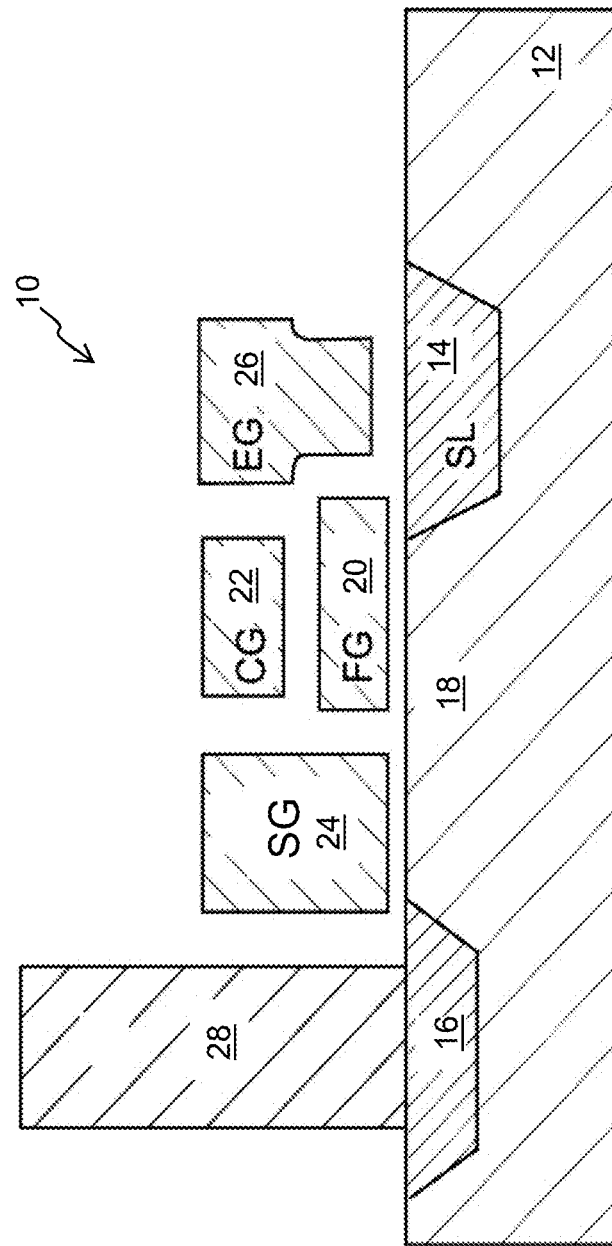
FIG. 1 is a side cross sectional view of a conventional memory cell.

The present examples illustrate a technique for compensating RTN after programming of non-volatile memory cells, such as the split gate memory cell 10 of FIG. 1 is completed, by performing post-program tuning to improve read operation accuracy.

Figure 2:
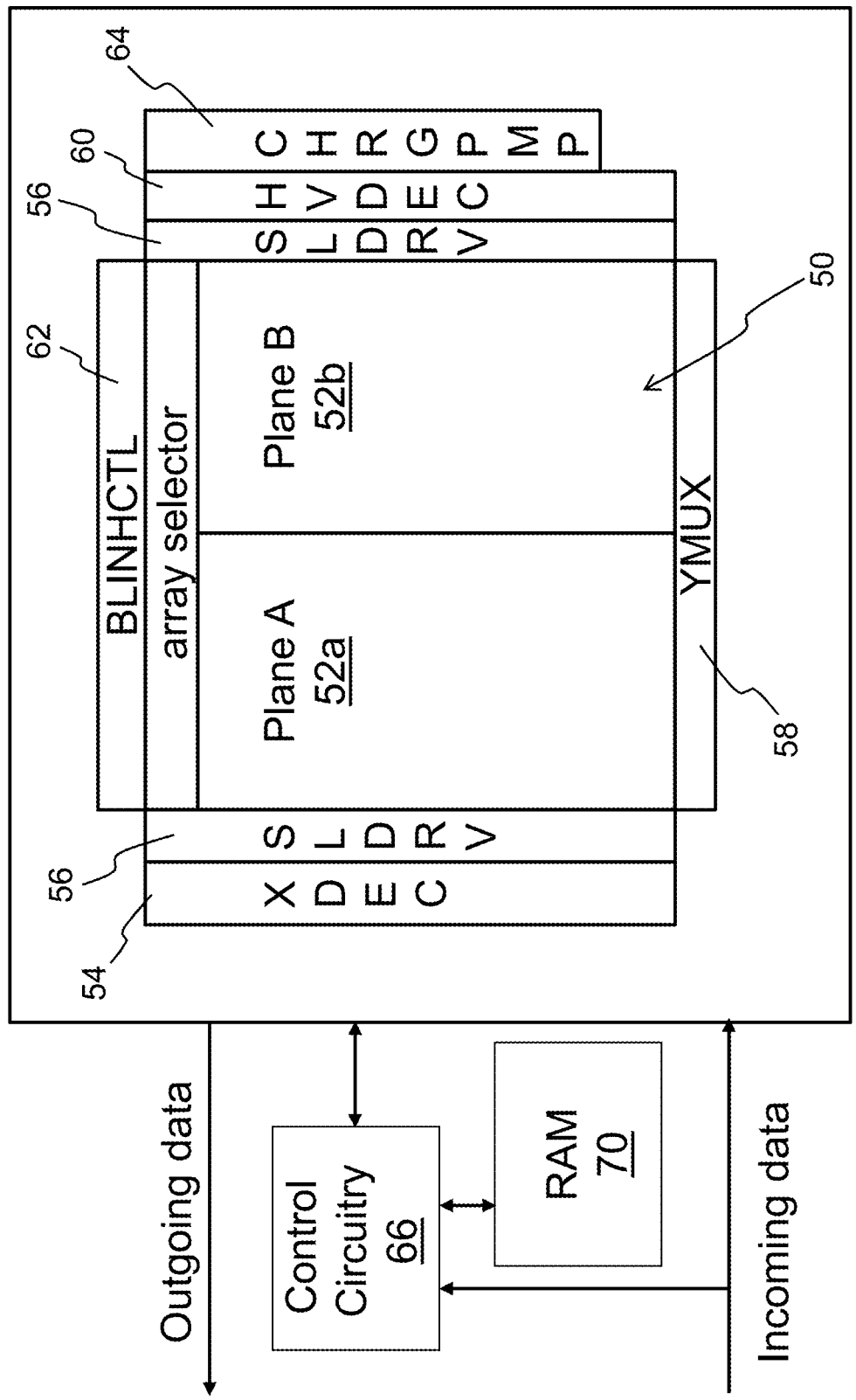
FIG. 2 is a diagram illustrating the components of a memory device.

The memory cell programming and post-program tuning techniques are implemented as part of the configuration of the control circuitry 66, which controls the various device elements for the memory array, which can be better understood from the architecture of an example memory device as illustrated in FIG. 2. The memory device includes an array 50 of the split gate memory cells 10, which can be segregated into two separate planes (Plane A 52a and Plane B 52b). The split gate memory cells 10 can be of the type shown in FIG. 1, arranged in a plurality of rows and columns in the semiconductor substrate 12, and thus formed on a single chip. Adjacent to the array of array 50 of split gate memory cells 10 are an address decoder (e.g. XDEC 54), source line drivers (e.g. SLDRV 56), a column decoder (e.g. YMUX 58), a high voltage row decoder (e.g. HVDEC 60) and a bit line controller (e.g. BLINHCTL 62), which are used to decode addresses and supply the various voltages to the various gates and regions of the split gate memory cells 10 during read, program, and erase operations for selected split gate memory cells 10 of the array 50. Column decoder 58 includes a sense amplifier containing circuitry for measuring the currents on the bit lines during a read operation. Control circuitry 66 is configured to control the various device elements to implement each operation (program, erase, read) on selected split gate memory cells 10 of the array 50 as described herein. Charge pump CHRGPMP 64 provides the various voltages used to read, program and erase the selected split gate memory cells 10 of the array 50 under the control of the control circuitry 66. Control circuitry 66 is configured to operate the memory device to program, erase and read the selected split gate memory cells 10 of the array 50. As part of these operations, the control circuitry 66 can be provided with access to incoming data which is data to be programmed to the selected split gate memory cells 10 of the array 50, along with program, erase and read commands provided on the same or different lines. Data read from the array 50, i.e. from selected split gate memory cells 10 of the array 50. is provided as outgoing data. The control circuitry 66 includes, or is provided access to, a separate memory such as random access memory (RAM) 70 for storing voltage values as described further below.

Figure 4:
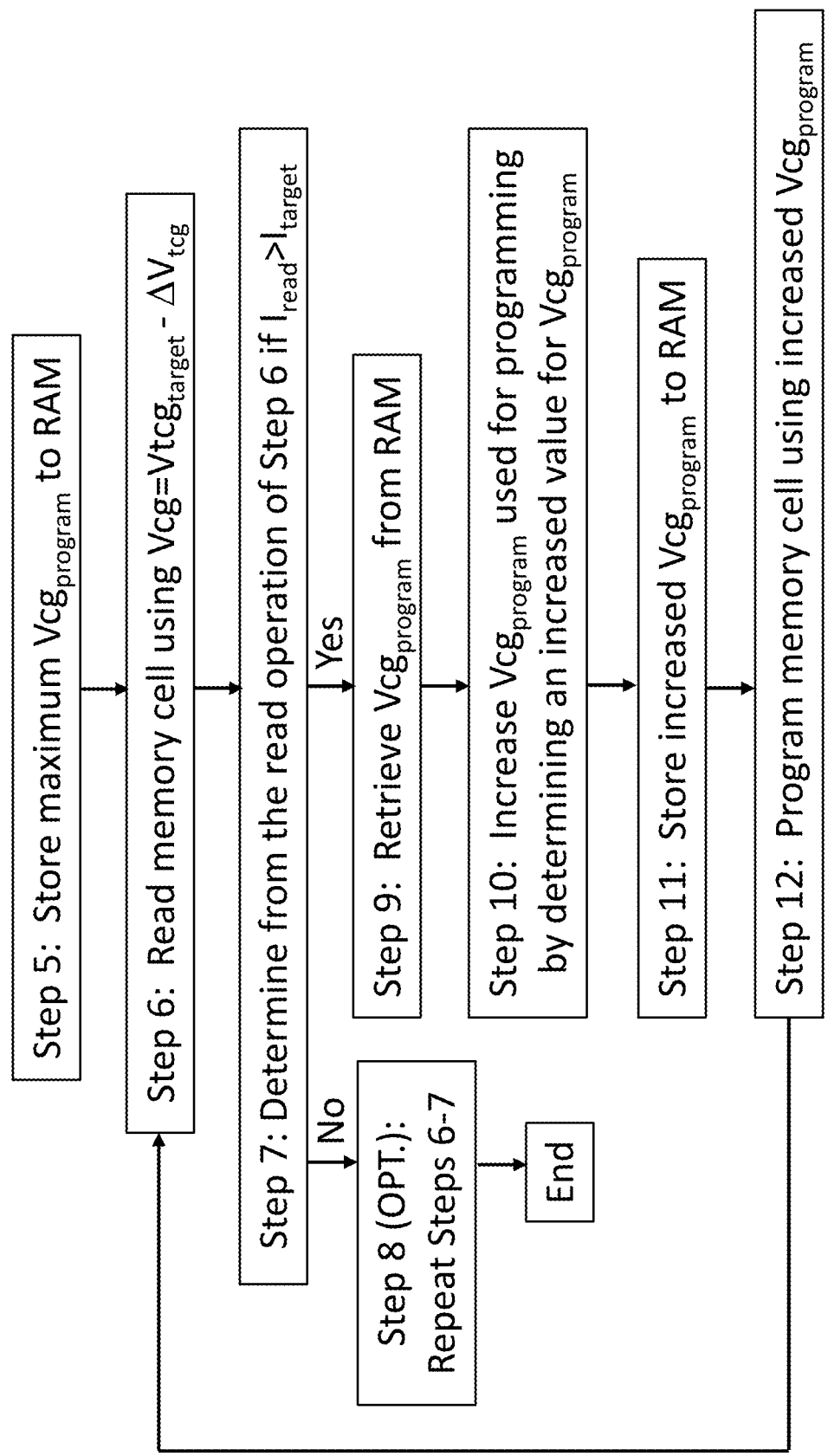
FIG. 4 is a flow diagram showing steps for post-program tuning of memory cells.

The post-program tuning technique involves the control circuitry 66 implementing memory cell initial programming, followed by post-program tuning for memory cells that exhibit an intolerable level of read current instability after initial programming. Memory cell programming is described first, followed by post-program tuning. Thus, control circuitry 66 may be loaded with software, i.e. non-transitory electronically readable instructions, or firmware, to perform the methods described below in relation to FIGS. 4-5, thereby being configured. Control circuitry 66 may be implemented by a microcontroller, dedicated circuitry, a processor, or a combination thereof.

Memory cell programming involves programming a selected memory cell to an initial programming state using programming voltage pulses, with intervening read operations to measure a threshold voltage parameter (i.e., a minimum voltage applied to the split gate memory cell 10 to achieve a predetermined level of source/drain current, referred to as a target current $I_{target}$) for the memory cell. The threshold voltage parameter is a control gate threshold voltage Vtcg, which is the threshold voltage of the memory cell as viewed from the control gate 22 (also referred to herein as the first gate). Specifically, the control gate threshold voltage Vtcg is the voltage placed on the control gate 22 that results in the channel region 18 being a conducting path, and therefore results in a read current through the channel of the predetermined level of source/drain current, also known as the target current ($I_{target}$) (e.g., 1 µA) to consider the memory cell turned on when the read potentials of a read operation are applied to the select gate 24 and drain region 16. The control gate threshold voltage Vtcg varies as a function of programming state of the split gate memory cell 10, but it is desired that once the split gate memory cell 10 is programmed to a particular programming state, any variation of control gate threshold voltage Vtcg over time be below a predetermined amount.

Figure 3:
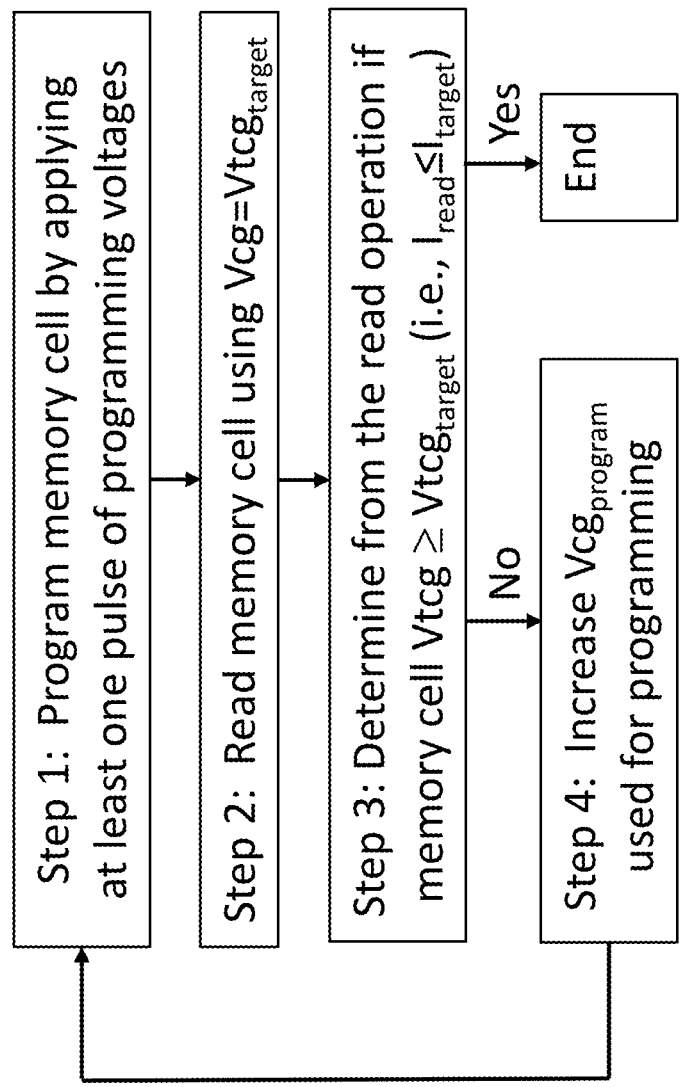
FIG. 3 is a flow diagram showing steps for programming memory cells.

Initial memory cell programming is illustrated as Steps 1-4 in FIG. 3, which is implemented to program a selected split gate memory cell 10 to a specific, desired, initial programming state so that it has a target control gate threshold voltage $Vtcg_{target}$ that is associated with that specific, desired, initial programming state. The technique begins in Step 1 with control circuitry 66 programming a selected split gate memory cell 10 of array 50. As described above, this programming step involves applying programming voltages to the selected split gate memory cell 10 for a limited time (i.e., in at least one pulse), which results in injecting electrons onto the floating gate 20. In the programming of Step 1, the voltage Vcg applied to the control gate 22 has a control gate program voltage $Vcg_{program}$ value. In Step 2, a read operation is performed which involves applying read voltages from for example SLDRV 56 to the selected split gate memory cell 10 and measuring, with column decoder 58 and bit line controller 62, the current flowing through the channel region 18 of the selected split gate memory cell 10, Tread. In this read operation, the voltage Vcg applied to the control gate 22 is the target control gate threshold voltage $Vtcg_{target}$. In Step 3, it is determined from the read operation of Step 2 whether or not the control gate threshold voltage Vtcg of the memory cell has reached or exceeded the target control gate threshold voltage $Vtcg_{target}$ (i.e., whether the read current Tread measured by column decoder 58 and bit line controller 62 is less than or equal to the target current $I_{target}$, where Tread equal to the target current $I_{target}$ is indicative of the control gate threshold voltage Vtcg of the memory cell reaching the target control gate threshold voltage $Vtcg_{target}$). Read current $I_{read}$ for Step 3 is also referred to herein as the second read current. If the determination is no (i.e., that the control gate threshold voltage Vtcg is not greater than or equal to the target control gate threshold voltage $Vtcg_{target}$), then in Step 4 the control gate program voltage $Vcg_{program}$ used for programming is increased relative to that used in the previous Step 1 programming of the memory cell, and then Step 1 is repeated using the increased control gate program voltage $Vcg_{program}$. Steps 1-4 are repeated, in order, by control circuitry 66, until it is determined in Step 3 that the control gate threshold voltage Vtcg of the memory cell has reached or exceeded the target control gate threshold voltage $Vtcg_{target}$ (i.e., that the read current Tread is less than or equal to the target current $I_{target}$). At that point, the memory cell is considered programmed to its desired, initial programming state (i.e. to its target control gate threshold voltage $Vtcg_{target}$). It is at this point where conventional programming usually ends.

However, if the programmed memory cell exhibits RTN after programming is completed, then electron(s) captured in interface trap(s) contribute to the measured control gate threshold voltage Vtcg of the memory cell as part of programming. If/when the electron(s) are emitted from the interface trap(s) after programming has ended, then the control gate threshold voltage Vtcg could drop by more than $\Delta Vtcg_{max}$ below the target control gate threshold voltage $Vtcg_{target}$, where $\Delta Vtcg_{max}$ is the maximum tolerable read error in terms of control gate threshold voltage Vtcg variation. A control gate threshold voltage drop by more than $\Delta Vtcg_{max}$ is considered to be an intolerable error during subsequent read operations. Therefore, post-program tuning begins with Step 5 in FIG. 4, where the maximum control gate program voltage $Vcg_{program}$ value (also referred herein as the first value) that was used in programming the memory cell (also referred to herein as the program voltage) is stored in memory (i.e., the last control gate program voltage $Vcg_{program}$ value used in programming the particular split gate memory cell, i.e., the last iteration of Step 4, unless the initial control gate program voltage $Vcg_{program}$ of Step 1 resulted in the control gate threshold voltage Vtcg of the memory cell reaching or exceeding the target control gate threshold voltage $Vtcg_{target}$ (i.e., that the read current Iread is less than or equal to the target current $I_{target}$), in which case the initial control gate program voltage $Vcg_{program}$ of Step 1 is the maximum control gate program voltage $Vcg_{program}$ value). In one example, the memory used to store the maximum $Vcg_{program}$ ram value is RAM 70 if post-program tuning is performed just after analog programming. However, if a user intends to perform post-program tuning sometime after analog programming, the maximum control gate program voltage $Vcg_{program}$ ram values can instead be stored in a file (e.g., in a non-volatile storage, accessible by control circuitry 66) to save the data for a longer period of time. Storing the maximum control gate program voltage $Vcg_{program}$ ram value is performed by control circuitry 66 after the split gate memory cell 10 is found to be programmed to its desired initial program state, as described above in relation to Step 3.

In Step 6, the split gate memory cell 10 is read (also referred to herein as a first read operation) using a control gate voltage Vcg that is less than the target control gate threshold voltage $Vtcg_{target}$ used in Step 2. Specifically, the control gate voltage Vcg used for this read operation is $Vtcg_{target} - \Delta V_{tcg}$, where $\Delta V_{tcg}$ can be, but need not be, the maximum tolerable deviation of control gate threshold voltage ($\Delta Vtcg_{max}$). As a non-limiting example, $\Delta V_{tcg}$ can be, for example, 20 mV. In Step 7, it is determined from the read operation of Step 6 whether or not the read current Iread is greater than the target read current $I_{target}$. Read current $I_{read}$ for Step 6 is also referred to herein as the first read current. If the memory cell does not exhibit post-program intolerable RTN, then the small decrease in control gate voltage Vcg by $\Delta V_{tcg}$ during the read operation of Step 6 should lower the read current Iread below, or further below, $I_{target}$, and the determination of Step 7 should be no, i.e. negative. In that case, the memory cell can be considered properly programmed and no post-program tuning is needed. However, as indicated in optional Step 8, Steps 6 and 7 can be repeated one or more times (where the repeated read operation is also referred to herein as a second read operation), whereby the memory cell will be subjected to another round of programming, as will be described below, if there is a positive determination in Step 7 no matter how many previous negative determinations occurred. Repeating Steps 6-7 even if the result in Step 7 is initially negative is advantageous because an electron may not necessarily be emitted from the trap before the first read, but could be emitted from the trap after the first read, and a yes, or positive, determination in Step 7 can occur in subsequent read operations if there is an electron emission after the first read operation.

If the memory cell does exhibit intolerable RTN, and if before or during this read operation there is interface trap electron emission, then the control gate threshold voltage $V_{tcg}$ of the memory cell will drop, resulting in a rise in read current $I_{read}$. If that rise in current exceeds $I_{target}$, then the determination of Step 7 will be yes, i.e. positive, and the selected split gate memory cell 10 is subjected to another round of programming starting at Step 9, where the maximum control gate program voltage $Vcg_{program}$ ram value stored in Step 5, i.e. in RAM 70 (or other memory) is retrieved. The retrieved control gate program voltage $Vcg_{program}$ ram value is increased in preparation for use in programming (see Step 10) (e.g., by determining a control gate program voltage $Vcg_{program}$ ram of increased value, also referred to herein as the second value), and the determined increased control gate program voltage $Vcg_{program}$ ram value is stored in RAM 70 (or other memory) (see Step 11). The memory cell is then programmed in Step 12 (similar to Step 1 described above) using the increased control gate program voltage $Vcg_{program}$ ram value. The process then reverts back to Step 6, where the memory cell is once again read as described above with respect to Step 6, followed by the determination of Step 7 as described above. If the subsequent determination in Step 7 is yes, i.e. positive, Steps 9-12 are performed again, followed by another read in Step 6 and determination in Step 7. If the subsequent determination in Step 7 is no, i.e. negative, post program tuning can end, or, steps 6-7 can be repeated one or more times as indicated in optional Step 8, even though Steps 9-12 may have been performed one or more times. There is no limitation on the number of read and determination operations (Steps 6-7) and on the number of rounds of programming (Steps 9-12). The number of times that Steps 6-7 and 9-12 are repeated can be user defined by taking into account desired programming time. The post-programing tuning process can also be repeated at a time after a previous instance of post-programming tuning, in which case the increased control gate program voltage $Vcg_{program}$ ram value can be stored in a more permanent memory such as a hard drive or other non-volatile storage, accessible by control circuitry 66, for longer term storage.

The advantage of the above described technique is that if the memory cell exhibits intolerable RTN after programming is initially completed, then it will still end up being more deeply programmed (i.e. exhibit a higher control gate threshold voltage $V_{tcg}$) than would otherwise be the case, so that the control gate threshold voltage $V_{tcg}$ will not vary from the target control gate threshold voltage $Vtcg_{target}$ by an undesired amount. By utilizing the above described technique, even if electron emission occurs, it is less likely that the control gate threshold voltage Vtcg of the split gate memory cell 10 will drop below the target control gate threshold voltage $Vtcg_{target}$ by an amount exceeding the tolerance level of $\Delta V_{tcg}$. This is because the split gate memory cell 10 is more deeply programmed above $Vtcg_{target}$ and future read operations will more accurately reflect the desired programming state of the memory cell within the tolerance level of $\Delta Vtcg$ variations.

Figure 5:
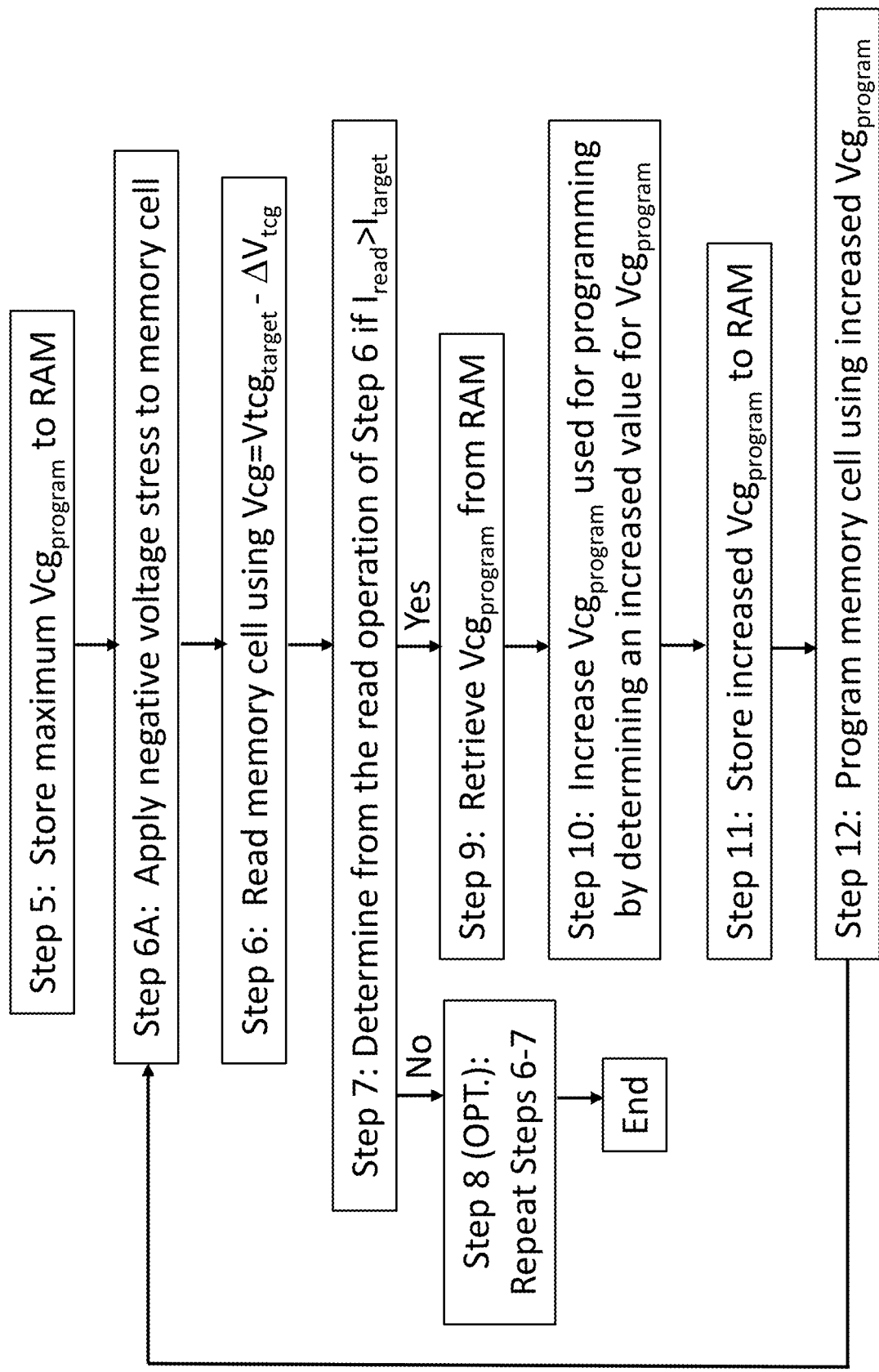
FIG. 5 is a flow diagram showing steps of a first alternate example for post-program tuning of memory cells.

FIG. 5 illustrates a first alternate example, which is the same method as that described above and depicted in FIGS. 3-4, and will not be described again, except Step 6A is added before Step 6, and after Step 12 the process reverts to Step 6A instead of to Step 6. Specifically, before the memory cell is read in Step 6, a negative voltage is applied to the memory cell sourced from for example SLDRV 56 under the control of control circuitry 66 (e.g. to any non-floating gate of the memory cell, such as the control gate 22, erase gate 26, and/or select gate 24), with the negative voltage defined in relation to the potential of substrate 12. This negative voltage applied to the split gate memory cell 10 induces electric field stress on the gate oxide of the split gate memory cell 10 to stimulate detrapping (emission) of electrons from the interface and near-interface oxide traps. In one example, the negative voltage is applied to the control gate 22, but it can additionally or alternatively be applied to any gate or terminal that is capacitively coupled to the floating gate 20. Therefore, for a split gate memory cell 10 that has an oxide trap which produces RTN, the negative voltage will help stimulate detrapping of electron, setting the control gate threshold voltage Vtcg to a lower threshold voltage Vt state, and increasing the chances that the determination of Step 7 will be positive (and therefore the memory cell will be subjected to additional programming). Since RTN has an erratic behavior, a defective memory cell may stay in one control gate threshold voltage Vtcg state even during the read operation of Step 6, and it will therefore not be properly identified for additional programming of steps 9-12. Therefore, application of a negative voltage (e.g., −1 V to −7 V) before the read operation of Step 6 may stimulate a memory cell with RTN to exhibit a lower control gate threshold voltage Vtcg state and, thereby, be identified in Step 7 for additional programming, enhancing programming efficiency and accuracy. There is some characteristic time during which memory cells maintain their control gate threshold voltage Vtcg state acquired under the applied voltage stress after its removal. Therefore, the delay between the negative voltage application of Step 6A and the read operation of Step 6 is in one example not longer than typical electron capture and emission time (100 ms at room temperature, as an example), otherwise, application of the negative voltage of step 6A prior to the read operation of step 6 may be less efficient.

It is to be understood that the above is not limited to the examples(s) described above and illustrated herein but encompasses any and all variations falling within the scope of any claims. For example, any references to the examples or invention herein are not intended to limit the scope of any claim or claim term, but instead merely relate to one or more features that may be covered by one or more of the claims. Materials, processes and numerical examples described above are examples only, and should not be deemed to limit the claims. Further, as is apparent from any claims and the specification, not all method steps need be performed in the exact order illustrated or claimed unless specified. The example of threshold voltage Vtcg used in the above described techniques is the threshold voltage of the memory cell as viewed from the control gate 22. However, the above described techniques could be implemented with respect to threshold voltage Vt as viewed from any one or more gates in the split gate memory cell 10 that is not floating. Additionally, the descriptions above could be implemented in an array of memory cells with fewer gates than those in FIG. 1 (e.g., no erase gate and/or control gate combined with select gate).

What is claimed is:

1. A memory device, comprising:
   a plurality of non-volatile memory cells each comprising a first gate; and
   a control circuitry to:
      program a selected non-volatile memory cell of the plurality of non-volatile memory cells to an initial program state so that the selected non-volatile memory cell achieves a target read current when a target threshold voltage is applied to the first gate of the selected non-volatile memory cell during read operations, wherein the programing of the selected non-volatile memory cell includes apply a program voltage having a first value to the first gate,
      store the first value in a memory,
      read the selected non-volatile memory cell in a first read operation using a read voltage applied to the first gate of the selected non-volatile memory cell that is less than the target threshold voltage for the first gate to generate a first read current, and
      subject the selected non-volatile memory cell to additional programming in response to a determination that the first read current is greater than the target read current, wherein the additional programming comprises:
         retrieve the first value from the memory,
         determine a second value greater than the first value, and
         program the selected non-volatile memory cell that includes applying a program voltage having the second value to the first gate.

2. The memory device of claim 1, wherein the control circuitry to store the second value in the memory.

3. The memory device of claim 1, wherein each of the plurality of non-volatile memory cells comprises:
   spaced apart source and drain regions formed in a semiconductor substrate, with a channel region of the substrate extending there between;
   a floating gate disposed vertically over and insulated from a first portion of the channel region; and
   a select gate disposed vertically over and insulated from a second portion of the channel region;
   wherein for each of the plurality of non-volatile memory cells, the first gate is disposed vertically over and insulated from the floating gate.

4. The memory device of claim 3, wherein each of the plurality of non-volatile memory cells comprises:
   an erase gate disposed over and insulated from the source region.

5. The memory device of claim 1, wherein the control circuitry to program of the selected non-volatile memory cell to the initial program state by:
   apply at least one first pulse of programming voltages to the selected non-volatile memory cell;
   read the selected non-volatile memory cell using a read voltage applied to the first gate of the selected non-volatile memory cell that is equal to the target threshold voltage for the first gate to generate a second read current; and
   apply at least one second pulse of programming voltages to the selected non-volatile memory cell in response to a determination that the second read current is not less than or equal to the target read current.

6. The memory device of claim 5, wherein the at least one first pulse of programming voltages includes a first program voltage applied to the first gate, and the at least one second pulse of programming voltages includes a second program voltage applied to the first gate that is greater than the first program voltage.

7. The memory device of claim 1, wherein the control circuitry to:
   read the selected non-volatile memory cell in a second read operation performed, in response to a determination that the first read current is not greater than the target read current in the first read operation, using a read voltage applied to the first gate of the selected non-volatile memory cell that is less than the target threshold voltage to generate a second read current, and
   subject the selected non-volatile memory cell to the additional programming in response to a determination that the second read current is greater than the target read current; and
   not subject the selected non-volatile memory cell to the additional programming in response to a determination that the second read current is not greater than the target read current.

8. The memory device of claim 1, wherein the control circuitry to apply a negative voltage to a non-floating gate of the selected non-volatile memory cell after the programming of the selected non-volatile memory cell to the initial program state and before the first read operation.

9. The memory device of claim 1, wherein the control circuitry to apply a negative voltage to the first gate of the one non-volatile memory cell after the programming of the one non-volatile memory cell to the initial program state and before the first read operation.

10. The memory device of claim 7, wherein the control circuitry to:
apply a negative voltage to the first gate of the selected non-volatile memory cell after the programming of the selected non-volatile memory cell to the initial program state and before the first read operation; and
apply a negative voltage to the first gate of the selected non-volatile memory cell after the determining that the first read current is not greater than the target read current in the first read operation and before the second read operation.

11. A method of programming a selected non-volatile memory cell of a plurality of non-volatile memory cells, wherein each of the plurality of non-volatile memory cells includes a first gate, the method comprising:
programming the selected non-volatile memory cell to an initial program state so that the selected non-volatile memory cell achieves a target read current when a target threshold voltage is applied to the first gate of the selected non-volatile memory cell during read operations, wherein the programing includes applying a program voltage having a first value to the first gate,
storing the first value in a memory,
reading the selected non-volatile memory cell in a first read operation using a read voltage applied to the first gate of the selected non-volatile memory cell that is less than the target threshold voltage to generate a first read current, and
subjecting the selected non-volatile memory cell to additional programming in response to determining that the first read current is greater than the target read current, wherein the additional programming comprises:
retrieving the first value from the memory,
determining a second value greater than the first value, and
programming the selected non-volatile memory cell that includes applying a program voltage having the second value to the first gate.

12. The method of claim 11, comprising:
storing the second value in the memory.

13. The method of claim 11, wherein each of the plurality of non-volatile memory cells comprises:
spaced apart source and drain regions formed in a semiconductor substrate, with a channel region of the substrate extending there between;
a floating gate disposed vertically over and insulated from a first portion of the channel region; and
a select gate disposed vertically over and insulated from a second portion of the channel region;
wherein for each of the plurality of non-volatile memory cells, the first gate is disposed vertically over and insulated from the floating gate.

14. The method of claim 13, wherein each of the plurality of non-volatile memory cells comprises:
an erase gate disposed over and insulated from the source region.

15. The method of claim 11, wherein the programming of the selected non-volatile memory cell to the initial program state comprises:
applying at least one first pulse of programming voltages to the selected non-volatile memory cell;
reading the selected non-volatile memory cell using a read voltage applied to the first gate of the selected non-volatile memory cell that is equal to the target threshold voltage to generate a second read current; and
applying at least one second pulse of programming voltages to the selected non-volatile memory cell in response to determining that the second read current is greater than the target read current.

16. The method of claim 15, wherein the at least one first pulse of programming voltages includes a first program voltage applied to the first gate, and the at least one second pulse of programming voltages includes a second program voltage applied to the first gate that is greater than the first program voltage.

17. The method of claim 11, comprising:
reading the selected non-volatile memory cell in a second read operation performed, in response to determining that the first read current is not greater than the target read current in the first read operation, using a read voltage applied to the first gate of the selected non-volatile memory cell that is less than the target threshold voltage to generate a second read current, and
subjecting the selected non-volatile memory cell to the additional programming in response to determining that the second read current is greater than the target read current; and
not subjecting the selected non-volatile memory cell to the additional programming in response to determining that the second read current is not greater than the target read current.

18. The method of claim 11, comprising:
applying a negative voltage to a non-floating gate of the selected non-volatile memory cell after the programming of the selected non-volatile memory cell to the initial program state and before the first read operation.

19. The method of claim 11, comprising:
applying a negative voltage to the first gate of the one non-volatile memory cell after the programming of the one non-volatile memory cell to the initial program state and before the first read operation.

20. The method of claim 17, comprising:
applying a negative voltage to the first gate of the selected non-volatile memory cell after the programming of the selected non-volatile memory cell to the initial program state and before the first read operation; and
applying a negative voltage to the first gate of the selected non-volatile memory cell after the determining that the first read current is not greater than the target read current in the first read operation and before the second read operation.

* * * * *